United States Patent
Shook

(10) Patent No.: US 9,325,241 B2
(45) Date of Patent: Apr. 26, 2016

(54) DEAD-TIME COMPENSATION IN A POWER SUPPLY SYSTEM

(71) Applicant: Texas Instruments Incorporated, Dallas, TX (US)

(72) Inventor: Adam L. Shook, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/816,652

(22) Filed: Aug. 3, 2015

(65) Prior Publication Data

US 2015/0340953 A1 Nov. 26, 2015

Related U.S. Application Data

(63) Continuation of application No. 13/754,028, filed on Jan. 30, 2013, now Pat. No. 9,128,498.

(60) Provisional application No. 61/592,282, filed on Jan. 30, 2012.

(51) Int. Cl.

| | |
|---|---|
| *H02M 3/157* | (2006.01) |
| *H02M 3/158* | (2006.01) |
| *G05F 1/10* | (2006.01) |
| *H02M 1/00* | (2006.01) |
| *H03K 17/16* | (2006.01) |
| *H02M 1/38* | (2007.01) |

(52) U.S. Cl.
CPC ............... *H02M 3/158* (2013.01); *G05F 1/10* (2013.01); *H02M 1/00* (2013.01); *H03K 17/165* (2013.01); *H02M 2001/385* (2013.01)

(58) Field of Classification Search
CPC ................. H02M 2001/0012; H02M 3/157

USPC .......................................................... 323/283
See application file for complete search history.

(56) References Cited

U.S. PATENT DOCUMENTS

| | | | |
|---|---|---|---|
| 6,396,250 B1 | 5/2002 | Bridge | |
| 7,456,620 B2 | 11/2008 | Maksimovic et al. | |
| 7,557,545 B2 | 7/2009 | Naka et al. | |
| 7,795,970 B2 | 9/2010 | Kaya et al. | |
| 7,906,942 B2 | 3/2011 | Sugahara et al. | |
| 8,395,362 B2 | 3/2013 | Brown et al. | |
| 2007/0126410 A1* | 6/2007 | Figoli | H02M 1/38 323/283 |
| 2010/0156376 A1* | 6/2010 | Fu | H02M 1/38 323/283 |
| 2011/0285373 A1* | 11/2011 | Matsui | H03K 5/06 323/283 |
| 2012/0062201 A1* | 3/2012 | Hachiya | H02M 3/1588 323/283 |
| 2013/0193938 A1 | 8/2013 | Shook | |

* cited by examiner

*Primary Examiner* — Gary L Laxton
(74) *Attorney, Agent, or Firm* — Tuenlap D. Chan; Frank D. Cimino

(57) ABSTRACT

One embodiment includes a power supply system. The system includes a pulse-width modulation (PWM) system configured to generate a PWM signal. The system also includes a power stage comprising a gate driver, a high-side switch, and a low-side switch. The gate driver can be configured to alternately activate the high-side and low-side switches to provide an output signal to a load in response to the PWM signal, and to provide an activation dead-time between the alternate activation of the high-side and low-side switches. The system further includes a digital delay system configured to measure the activation dead-time and to add the measured activation dead-time to the activation of the high-side switch.

20 Claims, 4 Drawing Sheets

DEAD-TIME COMPENSATION IN A POWER SUPPLY SYSTEM

CROSS-REFERENCE TO RELATED APPLICATIONS

This application claims priority to and the benefit of U.S. patent application Ser. No. 13/754,028, filed on Jan. 30, 2013, entitled "DEAD-TIME COMPENSATION IN POWER SUPPLY SYSTEM," which claims priority to and the benefit of U.S. Provisional Patent Application 61/592,282 filed on Jan. 30, 2012, entitled ADAPTIVE DEAD TIME CORRECTION FOR PWM DRIVERS. The entirety of these parent applications is incorporated by reference herein.

TECHNICAL FIELD

The present invention relates generally to electronic circuit systems, and specifically to dead-time compensation in a power supply system.

BACKGROUND

Power supply circuits, such as implemented in amplifiers, can implement a high-side switch and a low-side switch that are alternately activated to provide an output signal. The driver that provides the alternate activation of the high-side and low-side switches can be designed to ensure that the high-side and low-side switches are never activated concurrently to avoid a shoot-through current from a high-voltage rail to a low-voltage rail (e.g., ground). Thus, the driver can implement a "break before make" activation of the high-side switch with respect to the low-side switch by providing a predefined activation dead-time between activation of each of the high-side and low-side switches. However, the output signal can be substantially unstable during the activation dead-times. Furthermore, when the duty-cycle of the PWM signal is very short, the activation dead-time can undesirably shorten the activation of the high-side switch, and can possibly prevent activation of the high-side switch entirely, thus introducing distortion in the output signal.

SUMMARY

One embodiment includes a power supply system. The system includes a pulse-width modulation (PWM) system configured to generate a PWM signal. The system also includes a power stage comprising a gate driver, a high-side switch, and a low-side switch. The gate driver can be configured to alternately activate the high-side and low-side switches to provide an output signal to a load in response to the PWM signal, and to provide an activation dead-time between the alternate activation of the high-side and low-side switches. The system further includes a digital delay system configured to measure the activation dead-time and to add the activation dead-time to the activation of the high-side switch.

Another aspect of the invention includes a method for compensating for a PWM dead-time in a power supply system. The method includes generating a PWM signal and alternately activating a high-side switch and a low-side switch based on the PWM signal to generate an output signal at a switching node interconnecting the high-side low-side switches. The method also includes measuring a high-side activation dead-time in digital time increments between a rising-edge of the PWM signal and a rising-edge of the output signal. The method further includes adjusting the alternate activation of the high-side and low-side switches based on the measured high-side activation dead-time.

Another aspect of the invention includes a power supply system. The system includes a pulse-width modulation (PWM) system configured to generate a PWM signal. The system also includes a power stage comprising a gate driver, a high-side switch, and a low-side switch. The gate driver can be configured to alternately activate the high-side and low-side switches to provide an output signal to a load in response to a control signal, and to provide an activation dead-time between the alternate activation of the high-side and low-side switches. The system further includes a digital delay system. The digital delay system includes a delay circuit comprising a plurality of measurement stages that each correspond to a digital time increment and are configured to measure a high-side activation dead-time corresponding to a number of digital time increments between a rising-edge of the PWM signal and a rising-edge of the output signal, and to provide a delay signal having a pulse-width equal to the number of digital time increments. The digital delay system also includes a PWM adjust circuit configured to generate the control signal based on the PWM signal and the delay signal, such that the control signal has a pulse-width that is substantially equal to a sum of the pulse-width of the PWM signal and the delay signal.

DETAILED DESCRIPTION

This disclosure relates generally to electronic circuit systems, and specifically to dead-time compensation in a power supply system. A power supply system can include a pulse-width modulation (PWM) system that is configured to generate a PWM signal. As an example, the PWM signal can correspond to regulation of an output signal, or can be generated to provide a desired magnitude of the output signal. The power supply system can also include a power stage that generates the output signal. The power stage can include a gate driver that is configured to alternately activate a high-side switch and a low-side switch based on the PWM signal. The alternate activation of the high-side and low-side switches can be such that the gate driver provides an activation dead-time between activation of each of the high-side and low-side switches. As described herein, the term "high-side activation dead-time" corresponds to an activation dead-time between a rising-edge of the PWM signal and activation of the high-side switch, and the term "low-side activation dead-time" corresponds to an activation dead-time between a falling-edge of the PWM signal and activation of the low-side switch. The power supply system can also include a digital delay system that is configured to measure the high-side activation dead-time in digital time increments and to add the high-side activation dead-time to the activation of the high-side switch.

The digital delay system includes two delay circuits and a PWM adjust circuit. The digital delay systems alternately measure the high-side activation dead-time by measuring a difference between a rising-edge of the PWM signal and a rising-edge of the output signal. The digital delay systems can each include a plurality of sequentially-connected measurement stages that each correspond to a digital time increment, such that the high-side activation dead-time is measured in the digital time increments. The delay circuits thus alternately provide the measured high-side activation dead-time to the PWM adjust circuit to add the high-side activation dead-time to a pulse-width of the PWM signal. Therefore, for a given pulse of the PWM signal, one of the delay circuits measures the high-side activation dead-time while the other adds the high-side activation dead-time associated with the immediately preceding pulse of the PWM signal to the current pulse of the PWM signal. The PWM adjust circuit is configured to generate a control signal that is associated with the addition of the high-side activation dead-time to the PWM signal. Thus, the control signal can have a rising-edge that is approximately concurrent with the rising-edge of the PWM signal, but can have a falling-edge that is delayed with respect to the PWM signal by the high-side activation dead-time, as provided by the delay circuits.

Figure 1:
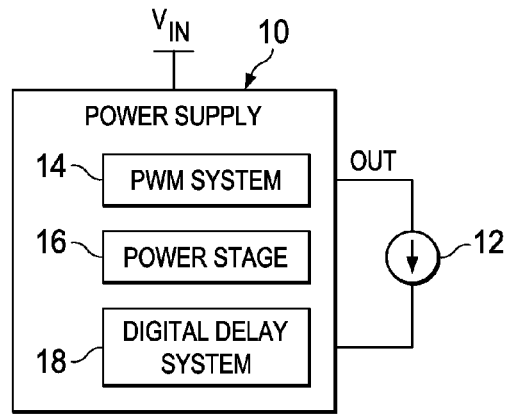
FIG. 1 illustrates an example of a power supply system in accordance with an aspect of the present invention.

FIG. 1 illustrates an example of a power supply system 10 in accordance with an aspect of the present invention. The power supply system 10 is configured to generate an output signal OUT based on an input voltage $V_{IN}$. The output signal OUT is provided to a load 12, demonstrated in the example of FIG. 1 as a constant current source. The load 12 can be representative of, for example, a series connection of an inductor and a resistor. The power supply system 10 can be implemented in a variety of power applications, such as in an audio application.

The power supply system 10 includes a pulse-width modulation (PWM) system 14, a power stage 16, and a digital delay system 18. The PWM system 14 is configured to generate a PWM signal having a pulse-width that is associated with a desired magnitude of the output signal OUT. For example, the PWM system 14 can generate the PWM signal in response to an input signal (not shown), such that the pulse-width of the PWM signal can be set by the input signal. As another example, the PWM signal can be generated based on a feedback voltage associated with the output signal OUT and/or the load 12. The power stage 16 is configured to generate the output signal OUT based on the PWM signal. For example, the power stage 16 can include a gate driver, a high-side switch, and a low-side switch. The gate driver can generate activation signals to alternately activate the high-side and low-side switches to generate the output signal OUT that is provided to the load 16. The activation of the high-side and low-side switches can include an activation dead-time, such as a predetermined delay time that is applied between activation of each of the switches. Therefore, the gate driver in the power stage 16 can ensure that the high-side and low-side switches are not concurrently activated to short the input voltage $V_{IN}$ to a low voltage rail (e.g., ground).

The digital delay system 18 is configured to measure the high-side activation dead-time and to add the measured high-side activation dead-time to the activation of the high-side switch in the power stage 16. For example, the digital delay system 18 can include at least one delay circuit that is configured to digitally measure a difference between the rising-edge of the PWM signal and a rising-edge of the output signal OUT, which thus corresponds to the high-side activation dead-time. As an example, the high-side activation dead-time can be measured by substantially equal and sequential measurement stages that each correspond to a plurality of digital time increments. The delay circuit could then provide the measured high-side activation dead-time to a PWM adjust circuit that is configured to add the measured high-side activation dead-time to a falling-edge of the PWM signal. For example, the PWM adjust circuit can generate a control signal that is provided to the gate driver in the power stage 16, with the control signal being based on the PWM signal and the measured high-side activation dead-time. The activation of the high-side switch by the gate driver can thus include the measured high-side activation dead-time based on the control signal.

Accordingly, the high-side activation dead-time is added to the PWM control activation of the high-side switch in the power stage 16. As a result, distortions associated with insufficient activation time or non-activation of the high-side switch, such as can degrade a total harmonic distortion (THD) associated with the power supply system 10 based on the introduction of the high-side activation dead-time, can be substantially mitigated. In addition, because the digital delay system 18 measures the high-side activation dead-time at each pulse of the PWM signal between a rising-edge of the PWM signal and a rising-edge of the output signal OUT, the digital delay system 18 continuously monitors the high-side activation dead-time in a closed-loop manner for more accurate tracking of the high-side activation dead-time to provide for a more resolute operation of the power supply system 10 than typical systems that may implement open-loop application of the high-side activation dead-time. Furthermore, because the digital delay system 18 is configured as a digital system for measuring and adding the high-side activation dead-time using an arrangement of logic, the digital delay system 18 can be implemented in a much less complex and less expensive solution than a comparable analog solution.

Figure 2:
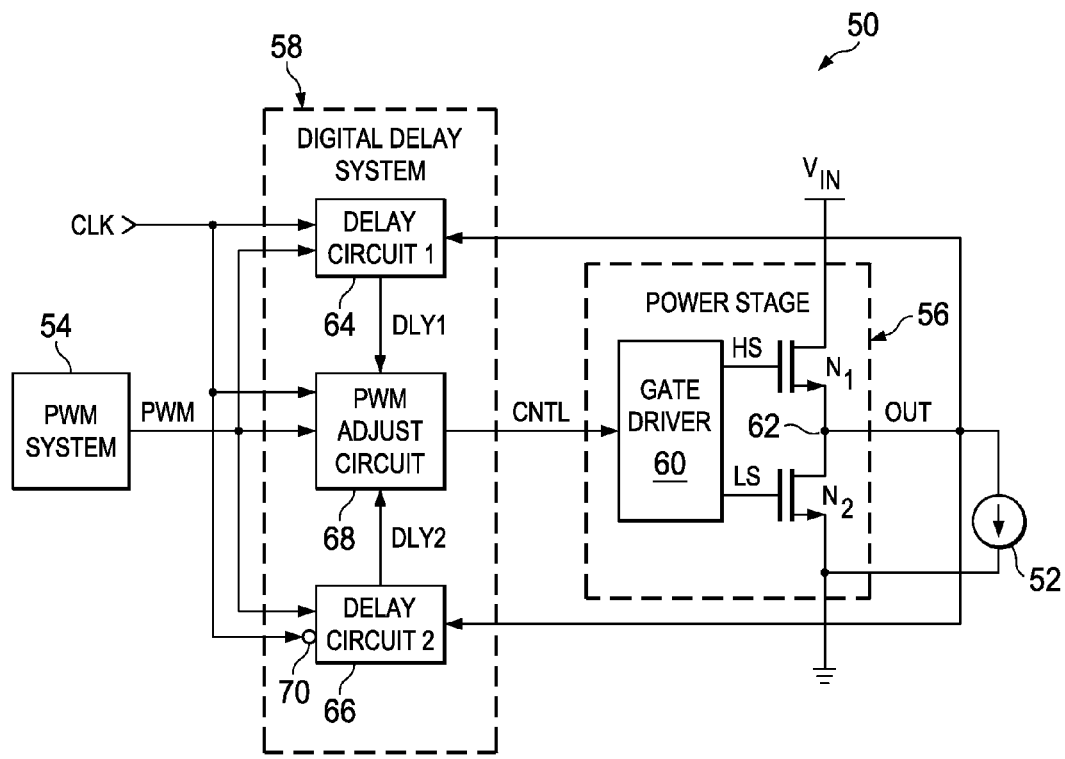
FIG. 2 illustrates another example of a power supply system in accordance with an aspect of the invention.

FIG. 2 illustrates another example of a power supply system 50 in accordance with an aspect of the invention. The power supply system 50 is configured to generate an output signal OUT based on an input voltage $V_{IN}$. The output signal OUT is provided to a load 52, demonstrated in the example of FIG. 1 as a constant current source. The load 52 can be representative of, for example, a series connection of an inductor and a resistor. The power supply system 50 can be implemented in a variety of power applications, such as in an audio application.

The power supply system 50 includes a PWM system 54, a power stage 56, and a digital delay system 58. The PWM system 54 is configured to generate a signal PWM having a pulse-width that is associated with a desired magnitude of the output signal OUT. For example, the PWM system 54 can generate the signal PWM in response to an input signal (not shown), such that the pulse-width of the signal PWM can be set by the input signal. As another example, the signal PWM can be generated based on a feedback voltage associated with the output signal OUT and/or the load 52.

The power stage 56 includes a gate driver 60, a high-side switch $N_1$ and a low-side switch $N_2$. The power stage 56 is configured to generate the output signal OUT at a switching node 62 based on alternately activating the high-side and low-side switches $N_1$ and $N_2$ based on respective high-side and low-side switching signals HS and LS. The activation of the high-side and low-side switches $N_1$ and $N_2$ based on the respective high-side and low-side switching signals HS and LS can include an activation dead-time, such as a predetermined delay time that is applied between activation of each of the switches. For example, the high-side activation dead-time can include a predetermined delay time that is applied after a rising-edge of the signal PWM before activation of the high-side switch $N_1$ based on the activation signal HS, and the low-side activation dead-time can include a predetermined delay time that is applied after deactivating the high-side switch $N_1$ via the activation signal HS before activation of the low-side switch $N_2$ via the activation signal LS. Therefore, the gate driver 62 can ensure that the high-side and low-side switches are not concurrently activated to short the input voltage $V_{IN}$ to a low voltage rail, demonstrated in the example of FIG. 2 as ground.

The digital delay system 58 includes a first delay circuit 64, a second delay circuit 66, and a PWM adjust circuit 68. The first and second delay circuits 64 and 66 are configured to alternately measure the high-side activation dead-time and to alternately provide the measured high-side activation dead-time to the PWM adjust circuit 68, demonstrated in the example of FIG. 2 as via respective delay signals DLY1 and DLY2. In the example of FIG. 2, the first and second delay circuits 64 and 66 and the PWM adjust circuit 68 are each provided a clock signal CLK that can have a frequency corresponding to two periods of the signal PWM. The second delay circuit 66 is provided the clock signal CLK via an inverter 70, such that the first and second delay circuits 64 and 66 operate concurrently but alternately with respect to their respective functions. Therefore, the alternate measurement and providing of the high-side activation dead-time by the first and second delay circuits 64 and 66 can be such that the first delay circuit 64 measures the high-side activation dead-time associated with a given pulse of the signal PWM while the second delay circuit 66 provides the high-side activation dead-time associated with the immediately preceding pulse of the signal PWM to the PWM adjust circuit 68 via the delay signal DLY2. Accordingly, for the next pulse of the signal PWM, the second delay circuit 66 measures the high-side activation dead-time while the first delay circuit 64 provides the high-side activation dead-time associated with the immediately preceding pulse of the signal PWM to the PWM adjust circuit 68 via the delay signal DLY1.

The measurement of the high-side activation dead-time can be based on measuring a difference between the rising-edge of the signal PWM and a rising-edge of the output signal OUT. Each of the first and second delay circuits 64 and 66 can include a plurality of measurement stages that each correspond to a digital time increment. As an example, the plurality of measurement stages can each be configured as multiplexer/buffer stages, as described in greater detail herein. Therefore, the high-side activation dead-time by the respective first and second delay circuits 64 and 66 can be measured in the digital time increments.

The PWM adjust circuit 68 is configured to receive the measured high-side activation dead-time via the delay signals DLY1 and DLY2 and add the measured high-side activation dead-time to the signal PWM. In the example of FIG. 2, the PWM adjust circuit 68 is configured to generate a control signal CNTL that can correspond to an adjusted version of the signal PWM. For example, the control signal CNTL can have a rising-edge that is approximately concurrent with the signal PWM and can have a pulse-width that is a sum of the pulse-width of the signal PWM and the measured high-side activation dead-time added to the pulse-width. The control signal CNTL is thus provided to the gate driver 60 in the power stage 56, such that the gate driver 60 is configured to generate the high-side and low-side activation signals HS and LS based on the control signal CNTL. As a result, the high-side activation signal HS can remain asserted for additional time that approximately corresponds to the high-side activation dead-time associated with the previous pulse of the signal PWM. Accordingly, the high-side switch $N_1$ can remain activated for a duration that approximately corresponds to the pulse-width of the signal PWM based on the PWM adjust circuit 68 adding the measured high-side activation dead-time to the signal PWM in generating the control signal CNTL. As a result, distortions associated with insufficient activation time or non-activation of the high-side switch, such as can affect a THD associated with the power supply system 50, can be substantially mitigated.

It is to be understood that the power supply system 50 is not intended to be limited to the example of FIG. 2. For example, the power supply system 50 can include a variety of additional circuit components to operate to generate the output signal OUT that is provided to the load 52. For example, the power supply system 50 can include capacitive and/or resistive components to provide filtering and/or feedback control of the power supply system 50.

Figure 3:
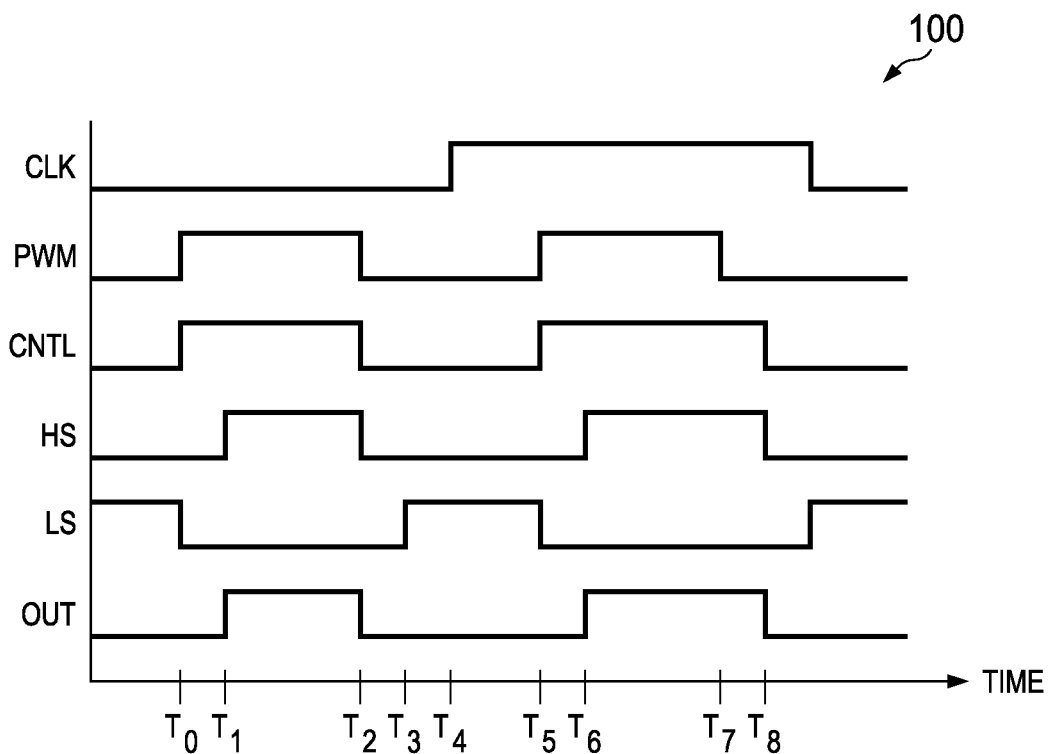
FIG. 3 illustrates an example of a timing diagram in accordance with an aspect of the present invention.

FIG. 3 illustrates an example of a timing diagram 100 in accordance with an aspect of the present invention. The timing diagram 100 includes a plurality of signals of the power supply system 50 demonstrated over time. In the example of FIG. 3, the signals include the clock signal CLK, the signal PWM, the control signal CNTL, the high-side activation signal HS, the low-side activation signal LS, and the output signal OUT. Therefore, reference is to be made to the example of FIG. 2 in the following description of the example of FIG. 3.

At a time $T_0$, the signal PWM is asserted while the clock signal CLK is at a logic-low state. The PWM adjust circuit 68, being provided the signal PWM, substantially concurrently asserts the control signal CNTL. During the time $T_0$, the high-side activation signal HS is logic-low, and thus the output signal OUT at the switching node 62 is at approximately zero volts. At the time $T_0$, in response to the signal PWM being asserted, the low-side activation signal LS is de-asserted. To prevent a shoot-through current from the input voltage $V_{IN}$ to ground, the gate driver 60 implements a predetermined high-side activation dead-time with respect to assertion of the high-side activation signal HS for activating the high-side switch $N_1$. Therefore, in response to the rising-edge of the signal PWM, the gate driver 60 delays assertion of the high-side activation signal HS by a predetermined time, thus asserting the high-side activation signal HS at a time $T_1$. In response to the assertion of the high-side activation signal HS, the high-side switch $N_1$ is activated, which couples the input voltage $V_{IN}$ to the switching node 62 to increase the output signal OUT. While the example of FIG. 3 demonstrates that the output signal OUT increases at the time $T_1$, and thus the same time that the high-side activation signal HS is asserted, it is to be understood that the output signal OUT increases in response to the activation of the high-side switch $N_1$ based on the assertion of the high-side activation signal HS, and thus at a time just subsequent to the assertion of the high-side activation signal HS.

Beginning at the time $T_0$, the digital delay system 58 can begin measuring the high-side activation dead-time. For example, based on the state of the clock signal CLK, the first delay circuit 64 can begin timing a number of predetermined digital time increments corresponding to the high-side activation dead-time in response to the rising-edge of the signal PWM. In response to the rising-edge of the output signal OUT at approximately the time $T_1$, the first delay circuit 64 can stop timing the number of predetermined digital time increments corresponding to the high-side activation dead-time. After stopping the timing of the number of the predetermined digital time increments corresponding to the high-side activation dead-time, and thus completing measurement of the high-side activation dead-time, the first delay circuit 64 can store the measured high-side activation dead-time, as described in greater detail herein, such that the measured high-side activation dead-time can be provided to the PWM adjust circuit 68 for adding the measured high-side activation dead-time to a next pulse of the signal PWM.

At a time $T_2$, the signal PWM is de-asserted while the clock signal CLK remains at the logic-low state. The PWM adjust circuit 68, being provided the signal PWM, substantially concurrently de-asserts the control signal CNTL, and thus the high-side activation signal HS. The high-side switch $N_1$ is therefore deactivated, which sets the output signal OUT to approximately zero volts. It is to be understood that the substantially concurrent de-assertion of the signal PWM and the control signal CNTL is demonstrated in the example of FIG. 3 for purposes of explanation or to demonstrate initial operation of the power supply circuit 50 (i.e., the pulse of the signal PWM beginning at the time $T_0$ being the first pulse). During normal operation of the power supply system 50, the control signal CNTL has a falling-edge that is delayed relative to the falling-edge of the signal PWM based on the addition of the high-side activation dead-time to the falling-edge of the signal PWM, as described in greater detail herein.

At the time $T_2$, in response to the signal PWM being de-asserted, the gate driver 60 implements a predetermined low-side activation dead-time with respect to assertion of the low-side activation signal LS for activating the low-side switch $N_2$. Thus, the gate driver 60 can prevent shoot-through current from the input voltage $V_{IN}$ to ground. Therefore, in response to the falling-edge of the signal PWM, the gate driver 60 delays assertion of the low-side activation signal LS by a predetermined time, thus asserting the low-side activation signal LS at a time $T_3$. In response to the assertion of the low-side activation signal LS, the low-side switch $N_2$ is activated, which couples the switching node 62 to ground.

At a time $T_4$, the clock signal CLK switches to a logic-high state. Thus, the functions of the first and second delay circuits 64 and 66 reverse with respect to the next pulse of the signal PWM. At a time $T_5$, the signal PWM is asserted. The PWM adjust circuit 68 substantially concurrently asserts the control signal CNTL. At the time $T_4$, in response to the signal PWM being asserted, the low-side activation signal LS is de-asserted. As described previously, to prevent the shoot-through current from the input voltage $V_{IN}$ to ground, the gate driver 60 implements the predetermined high-side activation dead-time with respect to assertion of the high-side activation signal HS for activating the high-side switch $N_1$. Therefore, in response to the rising-edge of the signal PWM, the gate driver 60 delays assertion of the high-side activation signal HS by the predetermined time, thus asserting the high-side activation signal HS at a time $T_6$. In response to the assertion of the high-side activation signal HS, the high-side switch $N_1$ is activated, which couples the input voltage $V_{IN}$ to the switching node 62 to increase the output signal OUT.

Beginning at the time $T_5$, the digital delay system 58 can again begin measuring the high-side activation dead-time. Because the state of the clock signal CLK is logic-high at the time $T_6$, as opposed to the time $T_0$, the second delay circuit 66 can begin timing a number of predetermined digital time increments corresponding to the high-side activation dead-time in response to the rising-edge of the signal PWM. In response to the rising-edge of the output signal OUT at approximately a time $T_6$, the second delay circuit 66 can stop timing the number of predetermined digital time increments corresponding to the high-side activation dead-time. After stopping the timing of the number of the predetermined digital time increments corresponding to the high-side activation dead-time, and thus completing measurement of the high-side activation dead-time, the second delay circuit 66 can store the measured high-side activation dead-time, such that the measured high-side activation dead-time can be provided to the PWM adjust circuit 68 for adding the measured high-side activation dead-time to a next pulse of the signal PWM (e.g., during the next logic-low state of the clock signal CLK).

At a time $T_7$, the signal PWM is de-asserted while the clock signal CLK remains at the logic-high state. During the logic-high state of the clock signal CLK, the PWM adjust circuit 68 receives the delay signal DLY1 from the first delay circuit 64, with the delay signal DLY1 corresponding to the high-side activation dead-time that was measured between the rising-edge of the signal PWM at the time $T_0$ and the rising-edge of the output signal OUT at approximately the time $T_1$. The PWM adjust circuit 68 is thus configured to add the measured high-side activation dead-time provided by the delay signal DLY1 to the falling-edge of the signal PWM in generating the control signal CNTL. Therefore, the PWM adjust circuit 68 delays the falling-edge of the control signal CNTL by approximately the high-side activation dead-time measured between the rising-edge of the signal PWM at the time $T_0$ and the rising-edge of the output signal OUT at approximately the time $T_1$. At a time $T_8$, the PWM adjust circuit 68 de-asserts the control signal CNTL. As a result, the gate driver 60 thus likewise de-asserts the high-side activation signal HS to deactivate the high-side switch $N_1$ at the time $T_8$. As a result, the high-side switch $N_1$ remains activated for a duration that is approximately equal to the length of the pulse of the signal PWM based on the addition of the high-side activation dead-time to the falling-edge of the pulse of the signal PWM, such that the output signal OUT can be generated at a sufficient level based on the activation of the high-side switch $N_1$. Accordingly, the digital delay system 58 is configured to substantially mitigate distortion of the output signal OUT to compensate for introduction of the high-side activation dead-time to the operation of the gate driver 60.

Figure 4:
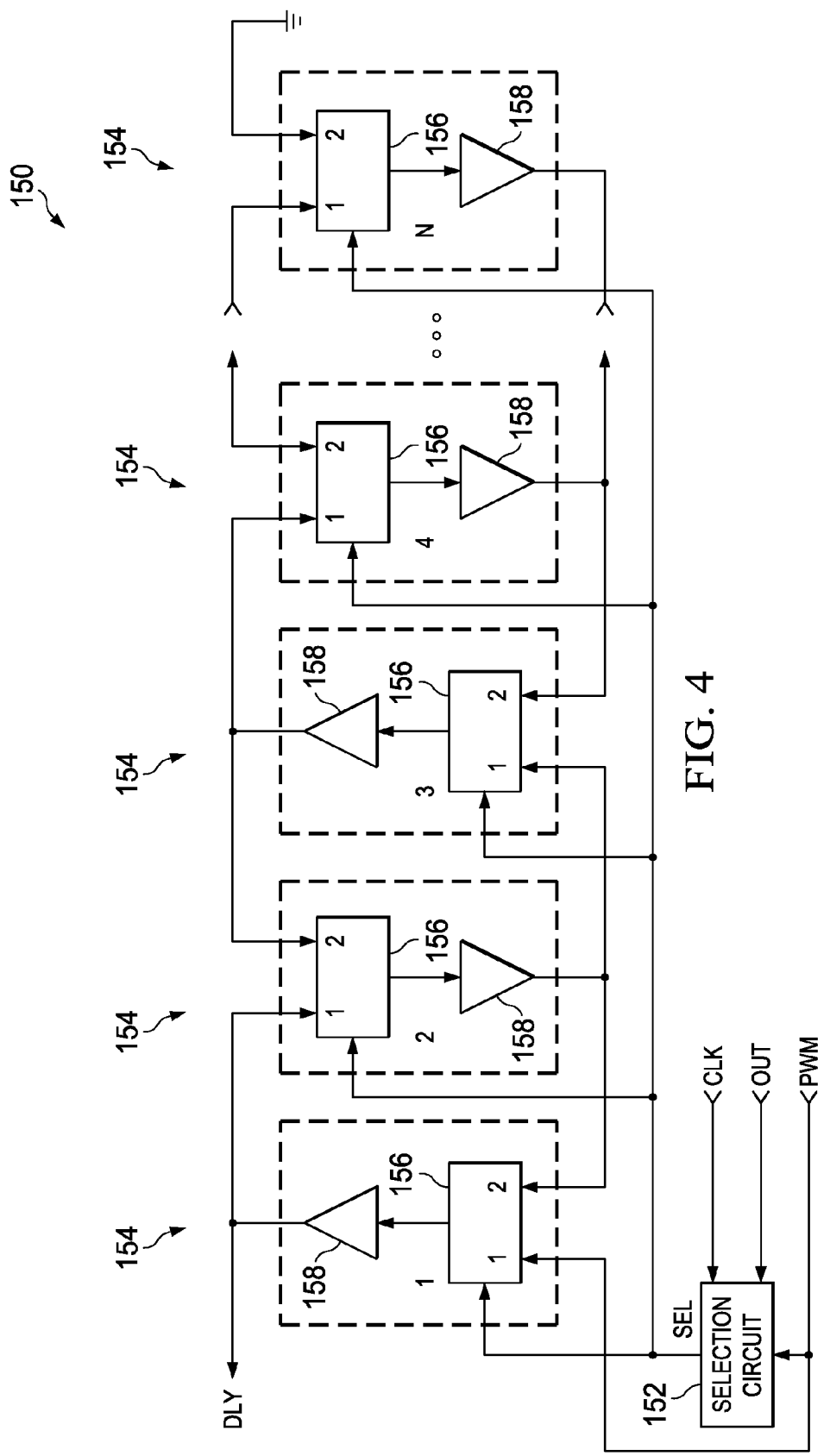
FIG. 4 illustrates an example of a delay circuit in accordance with an aspect of the present invention.

FIG. 4 illustrates an example of a delay circuit 150 in accordance with an aspect of the present invention. The delay circuit 150 can correspond to one of the first and second delay circuits 64 and 66 in the example of FIG. 2. Therefore, reference is to be made to the example of FIG. 2 in the following description of the example of FIG. 4. For example, each of the first and second delay circuits 64 and 66 can be configured substantially similar to the delay circuit 150.

The delay circuit 150 includes a selection circuit 152 and a plurality N of sequentially connected measurement stages 154, where N is a positive integer greater than one. Each of the measurement stages 154 can correspond to a digital time increment for measuring the high-side activation dead-time. In the example of FIG. 4, each of the measurement stages 154 includes a two-input multiplexer 156 and a buffer 158, with the output of the multiplexer 156 being provided to the input of the buffer 158. The sequential connection of the measurement stages 154 is such that the output of the buffer 158 of a given one of the measurement stages 154 is coupled to a first input of the multiplexer 156 in a next respective measurement stage 154 in the sequence and to a second input of the multiplexer 156 in a previous respective measurement stage 154 in the sequence. In the example of FIG. 4, the first input of a respective multiplexer 156 is demonstrated as a "1" input and the second input of a respective multiplexer 156 is demonstrated as a "2" input. The multiplexer 156 and the buffer 158 of each of the measurement stages 154 can be substantially process-matched components based on fabrication, such that the characteristics of the multiplexers 156 and the characteristics of the buffers 158 can be approximately the same for each of the measurement stages 154.

In the example of FIG. 4, the first input of the multiplexer 156 associated with the first of the sequential measurement stages 154, demonstrated in the example of FIG. 4 as the "1" stage, receives the signal PWM. In addition, the buffer 158 associated with the first measurement stage 156 provides the delay signal DLY, which is also coupled to the first input of the multiplexer 156 in a next respective measurement stage 154 in the sequence. Furthermore, in the example of FIG. 4, the second input of the multiplexer 156 associated with the last of the sequential measurement stages 154, demonstrated in the example of FIG. 4 as the "N" stage, is coupled to a low-voltage rail (e.g., ground).

Each multiplexer 156 of the measurement stages 154 receives an input selection signal SEL that is generated by the selection circuit 152 based on the clock signal CLK, the output signal OUT, and signal PWM. As an example, the input selection signal SEL can have three states: a first state corresponding to the first input of the multiplexers 156, a second state corresponding to the second input of the multiplexers 156, and a third state corresponding to a hold state of the multiplexers 156. For example, the selection circuit 152 can correspond to a set of logic devices that are arranged to generate the input selection signal SEL in one of the three states based on a combination of states of the clock signal CLK, the output signal OUT, and the signal PWM. Initially, the logic-state at the first and second inputs of each of the multiplexers 156 in each of the measurement stages 154 can be set to logic-low.

During a first state of the clock signal CLK corresponding to measurement of the high-side activation dead-time (e.g., the logic-low state of the clock signal CLK in the example of FIG. 3), the input selection signal SEL can be set to the first state in response to a rising-edge of the signal PWM (e.g., at the time $T_0$). The rising-edge of the signal PWM can thus signify the delay circuit 150 to begin timing the high-side activation dead-time, as described previously in the example of FIG. 3. In the first state of the input selection signal SEL, each of the multiplexers 156 of the respective measurement stages 154 passes the first input to its respective output, and thus to the buffer 158 of the respective measurement stage. Therefore, the multiplexer 156 of the first measurement stage 154 passes the logic-high state of the signal PWM to the buffer 158, which asserts the delay signal DLY and passes a logic-high state output to the first input of the multiplexer 156 of the second measurement stage 154. The logic-high state therefore is sequentially passed from one measurement stage 154 to the next measurement stage 154 in the sequence (e.g., left-to-right/numerically ascending in the example of FIG. 4) for a duration of time that the input selection signal SEL is held in the first state.

As described previously, the high-side activation dead-time is measured between the rising-edge of the signal PWM and a rising-edge of the output signal OUT. Therefore, in response to a rising-edge of the output signal OUT (e.g., at the time $T_1$), the selection circuit 152 can change the state of the input selection circuit SEL from the first state to the third state. Therefore, the multiplexers 156 of each of the measurement stages 154 hold the respective outputs, regardless of the states of the first and second inputs. Accordingly, the buffers 158 of each of the measurement stages 156 no longer pass the logic-high state to the next measurement stage 154 in the sequence. Each of the multiplexers 156 and each of the buffers 158 of each of the respective measurement stages 154 has an associated delay time for passing the respective logic-high state from input to output, which can be approximately equal for each of the measurement stages 154 because the multiplexer 156 and the buffer 158 of each of the measurement stages 154 can be substantially process-matched components. Accordingly, the measurement stages 154 can each correspond to an approximately equal digital delay time in passing the logic-high state from one measurement stage 154 to the next. As a result, the high-side activation dead-time can be measured by the delay circuit 150 in digital time increments that each correspond to the number of measurement stages 154 that passed the logic-high state between the rising-edge of the signal PWM and the rising-edge of the output signal OUT based on the duration of time of the first state of the input selection signal SEL before the change to the third state. In the third state of the input selection signal SEL, the delay circuit 150 maintains the delay signal DLY at the logic-high state, such that the delay circuit 150 stores the measured high-side activation dead-time to be added to the next pulse of the signal PWM (e.g., in the control signal CNTL).

During a second state of the clock signal CLK corresponding to addition of the high-side activation dead-time to the pulse of the signal PWM (e.g., the logic-high state of the clock signal CLK in the example of FIG. 3), the input selection signal SEL can remain in the third state until the falling-edge of the signal PWM. In response to the falling-edge of the signal PWM (e.g., at the time $T_7$), the input selection signal SEL can be set to the second state. The falling-edge of the signal PWM can thus signify the delay circuit 150 to begin adding the measured high-side activation dead-time, as described previously in the example of FIG. 3. In the second state of the input selection signal SEL, each of the multiplexers 156 of the respective measurement stages 154 passes the second input to its respective output, and thus to the buffer 158 of the respective measurement stage 154.

Therefore, based on the second state of the input selection signal SEL, the multiplexer 156 of the $N^{th}$ measurement stage 154 passes the logic-low state of the low-voltage rail (e.g., ground) to the buffer 158, and the buffer 158 of the $N^{th}$ measurement stage 154 passes a logic-low state output to the second input of the multiplexer 156 of the preceding (e.g., N−1) measurement stage 154. Additionally, the multiplexers 156 of each of the respective measurement stages 154 to which the logic-high state was not passed during the measurement of the high-side activation dead-time (e.g., the first state of the clock signal CLK) also passes the logic-low state to the next preceding measurement stage 154 in the sequence (e.g., right-to-left/numerically descending in the example of FIG. 4). In addition, the multiplexers 156 of each of the respective measurement stages 154 to which the logic-high state was passed during the measurement of the high-side activation dead-time (e.g., the first state of the clock signal CLK) also passes the logic-high state to the next preceding measurement stage 154 in the sequence. The delay signal DLY thus remains in the logic-high state during the second state of the input selection signal SEL until the logic-low state is passed to the output of the first measurement stage 154, at which time the delay signal DLY is de-asserted to the logic-low state, and the logic-state at the first and second inputs of each of the multiplexers 156 in each of the measurement stages 154 is set to logic-low.

As described previously, the high-side activation dead-time was stored in the delay circuit 150 based on the number of the measurement stages 154 through which the logic-high state had propagated in each of the digital time increments during the first state of the clock signal CLK (i.e., the measurement state of the delay circuit). Therefore, because the amount of time to propagate the logic-low state through each of the measurement stages 154 is approximately equal to the amount of time to propagate the logic-high state through each of the measurement stages 154, then the propagation of the logic-low state during the second state of the clock signal CLK (i.e., the addition state of the delay circuit) from the time that the input selection signal SEL is switched to the second state at the falling-edge of the signal PWM to the time that the delay signal DLY is de-asserted to the logic-low state is approximately equal to the measured high-side activation dead-time. Therefore, as described in greater detail herein, the de-assertion of the delay signal DLY can correspond to the falling-edge of the control signal CNTL.

Figure 5:
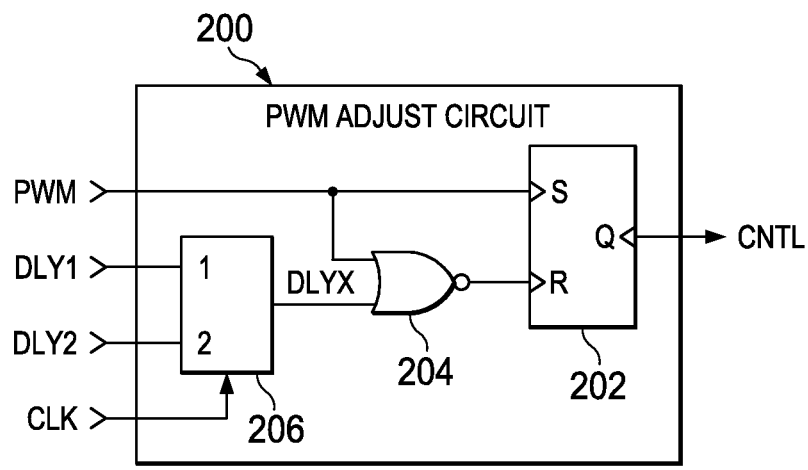
FIG. 5 illustrates an example of a pulse-width modulation (PWM) adjust circuit in accordance with an aspect of the present invention.

FIG. 5 illustrates an example of a PWM adjust circuit 200 in accordance with an aspect of the present invention. The PWM adjust circuit 200 can correspond to the PWM adjust circuit 68 in the example of FIG. 2, and can be configured to receive the delay signal DLY from the delay circuit 150 as one of the respective signals DLY1 and DLY2. Therefore, reference is to be made to the example of FIGS. 2-4 in the following description of the example of FIG. 5.

The PWM adjust circuit 200 includes an SR-latch 202, a NOR gate 204, and a multiplexer 206. The SR-latch 202 receives the signal PWM at the "S" input, receives the output of the NOR gate 204 at the "R" input, and provides the control signal CNTL at the "Q" output. The NOR gate 204 receives the signal PWM and a signal DLYX at respective inputs. The multiplexer 206 receives the first and second delay signals DLY1 and DLY2 at respective first and second inputs, and receives the clock signal CLK as a selection input. The PWM adjust circuit 200 is therefore configured to generate the control signal CNTL based on the signal PWM and the delay signal DLY, as provided in the example of FIG. 4, which corresponds to a given one of the signals DLY1 and DLY2 based on the state of the clock signal CLK.

Initially, the clock signal CLK can have a logic-low state (e.g., prior to the time $T_4$), such that the "1" input is selected for the multiplexer 206 to provide the first delay signal DLY1 as the signal DLYX. For example, the first delay signal DLY1 can have logic-high state corresponding to the delay circuit 150 having measured the high-side activation dead-time associated with the immediately preceding pulse of the signal PWM. The first delay signal DLY1 can remain at the logic-high state based on the selection circuit 152 providing the input selection signal SEL at the third state to hold the values of the respective multiplexers 156.

Upon a rising-edge of the signal PWM, the "S" input of the SR-latch 202 is logic-high and the "R" input of the SR-latch 202 is logic-low based on the output of the NOR gate 204. In response, the SR-latch 202 asserts the control signal CNTL, such that the control signal CNTL has a rising-edge at approximately the same time as the rising-edge of the signal PWM (e.g., the time $T_5$). Upon a falling-edge of the signal PWM (e.g., the time $T_7$), the "S" input of the SR-latch 202 is logic-low, but the "R" input of the SR-latch 202 remains logic-low according to the output of the NOR gate 204 based on the state of the signal DLYX remaining logic-high. In response, the SR-latch 202 maintains the control signal CNTL at the logic-high state. In addition, in response to the falling-edge of the signal PWM, the selection circuit 152 changes the input selection signal SEL to the second state to begin adding the measured high-side activation dead-time to the falling-edge of the signal PWM. Thus, the first delay signal DLY1 (e.g., the delay signal DLY in the example of FIG. 4) remains logic-high until the number of digital time increments (e.g., the number of measurement stages 154 having output the logic-high state) corresponding to the measured high-side activation dead-time have expired (e.g., at the time $T_8$).

Upon expiration of the measured high-side activation dead-time (e.g., at the time $T_8$), based on all of the measurement stages 154 outputting the logic-low state, the first delay signal DLY1 is de-asserted. In response, the signal DLYX is likewise de-asserted, which changes the output of the NOR gate 204 from a logic-low state to a logic-high state. Upon the "R" input of the SR-latch 202 being de-asserted to the logic-low state, the control signal CNTL is likewise de-asserted to the logic-low state. Accordingly, the falling-edge of the control signal CNTL is delayed relative to the falling-edge of the signal PWM by approximately the high-side activation dead-time. Because the gate driver 60 in the power stage 56 is controlled based on the control signal CNTL, the high-side switch $N_1$ can remain activated for a duration that is approximately equal to a pulse-width of the signal PWM while still activating after the high-side activation dead-time. Therefore, the power supply system 50 can operate in a manner in which distortion resulting from the introduction of the high-side activation dead-time is substantially mitigated.

As described previously, the clock signal CLK can have the logic-low state during this addition of the high-side activation dead-time to the signal PWM in generating the control signal CNTL. Therefore, during this time in which the clock signal CLK has the logic-low state, the delay circuit 150 that is configured to provide the second delay signal DLY2 can measure the high-side activation dead-time of the pulse of the signal PWM (e.g., between approximately the time $T_5$ and the time $T_6$). After the time $T_8$, in response to the clock signal CLK switching from the logic-low state to the logic-high state, the multiplexer 206 can provide the signal DLYX as the second delay signal DLY2. Accordingly, the PWM adjust circuit 200 can generate the control signal CNTL based on adding the measured high-side activation dead-time associated with the pulse of the signal PWM described previously, as provided by the second delay signal DLY2, to the falling-edge of the next pulse of the signal PWM.

Figure 6:
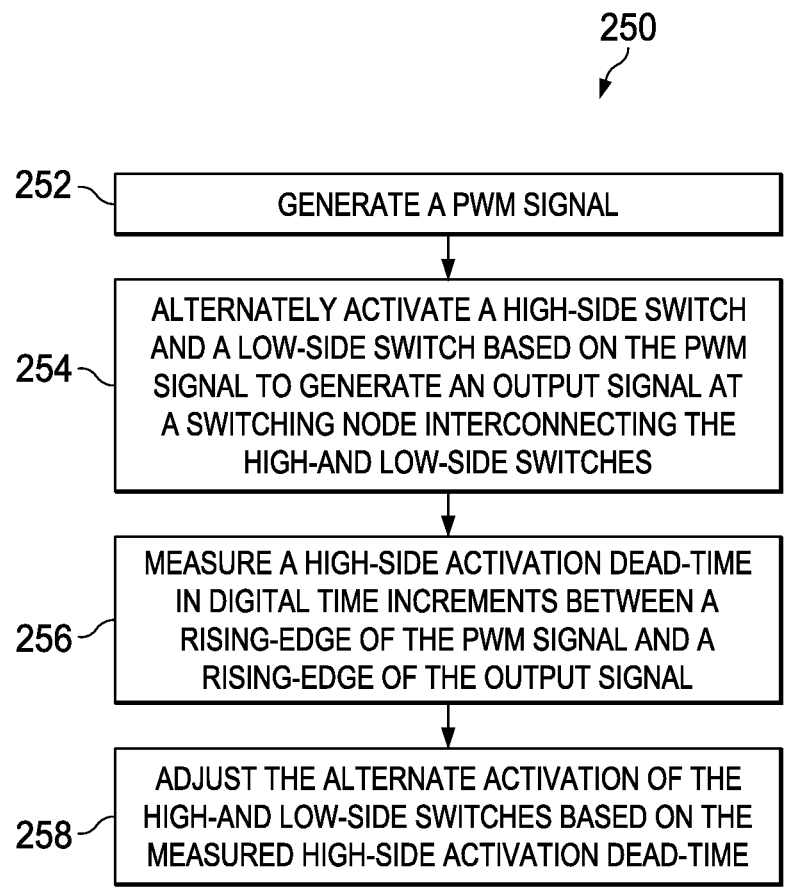
FIG. 6 illustrates an example of a method for compensating for a high-side activation dead-time in accordance with an aspect of the present invention.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method.

FIG. 6 illustrates an example of a method 250 for compensating for a high-side activation dead-time in accordance with an aspect of the present invention. At 252, a PWM signal (e.g., the signal PWM generated by the PWM system 54) is generated. At 254, a high-side switch (e.g., the high-side switch $N_1$) and a low-side switch (e.g., the low-side switch $N_2$) are alternately activated (e.g., by the gate driver 60) based on the PWM signal to generate an output signal (e.g., the output signal OUT) at a switching node interconnecting the high-side low-side switches (e.g., the switching node 62). At 256, a high-side activation dead-time is measured (e.g., by one of the first and second delay circuits 64 and 66) in digital time increments between a rising-edge of the PWM signal and a rising-edge of the output signal. At 258, the alternate activation of the high-side and low-side switches is adjusted (e.g., by the PWM adjust circuit 68) based on the measured high-side activation dead-time.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A power supply circuit comprising:
   a pulse-width modulation (PWM) circuit configured to generate a PWM signal including a first PWM pulse during a first time period and a second PWM pulse during a second time period after the first time period, the first PWM pulse having a first PWM pulse width, the second PWM pulse having a second PWM pulse width;
   a power stage coupled with the PWM circuit, the power stage configured to generate an activation signal for switching an output signal corresponding to the first PWM pulse during the first time period; and
   a delay circuit coupled between the PWM circuit and the power stage, the delay circuit configured to:
      measure an activation dead-time by comparing the first PWM pulse with the output signal during the first time period; and
      generate a control signal having an adjusted pulse width based on the second PWM pulse width and the measured activation dead-time, the control signal causing the power stage to prolong the activation signal during the second time period.

2. The power supply circuit of claim 1, wherein the delay circuit is configured to measure the activation dead-time by counting a time lapse between an input rising edge of the first PWM pulse and an output rising edge of the output signal during the first time period.

3. The power supply circuit of claim 1, wherein the power stage includes:
   a gate driver coupled with the delay circuit to receive the control signal, the gate driver configured to generate the activation signal based on a control rising edge of the control signal;
   a high-side switch coupled to the gate driver, the high-side switch configured to switch the output signal from a low voltage to a high voltage based on the activation signal.

4. The power supply circuit of claim 3, wherein:
   the gate driver is configured to generate a second activation signal based on a control falling edge of the control signal; and
   the power stage includeds a low-side switch coupled to the gate driver, the low-side switch configured to switch the output signal from the high voltage to the low voltage based on the second activation signal.

5. The power supply circuit of claim 1, wherein the power stage includes:
   a gate driver coupled with the delay circuit to receive the control signal, the gate driver configured to generate the activation signal based on a control rising edge of the control signal;
   a low-side switch coupled to the gate driver, the low-side switch configured to switch the output signal from a high voltage to a low voltage based on the activation signal.

6. The power supply circuit of claim 5, wherein:
   the gate driver is configured to generate a second activation signal based on a control falling edge of the control signal; and
   the power stage includes a high-side switch coupled to the gate driver, the high-side switch configured to switch the output signal from the low voltage to the high voltage based on the second activation signal.

7. The power supply circuit of claim 1, wherein the delay circuit includes:
   a delay measurement circuit configured to receive the output signal via a feedback connection with the power stage, the delay measurement circuit coupled with the PWM circuit to receive the PWM signal, and the delay measurement circuit having a series of measurement stages configured to measure the activation dead-time by counting a number of time intervals between an input rising edge of the first PWM pulse and an output rising edge of the output signal; and
   an adjustment circuit coupled to the delay measurement circuit to receive the measured activation dead-time, the adjustment circuit configured to generate the adjusted pulse width by adding the measured activation dead-time to the second PWM pulse width.

8. The power supply circuit of claim 7, wherein the adjustment circuit includes:
   a NOR gate configured to generate a reset signal in response to the PWM signal and a delay signal associated with the measured activation dead-time; and
   a SR-latch having an S input coupled with the PWM circuit to receive the PWM signal and an R input coupled with the NOR gate to receive the reset signal, the SR latch configured to generate the control signal in response to the PWM signal and the reset signal.

9. The power supply circuit of claim 1, wherein:
   the PWM circuit configure to generate the PWM signal including a third PWM pulse during a third time period after the second time period, the third PWM pulse having a third PWM pulse width;
   the delay circuit includes:
      a first delay measurement circuit having a first series of measurement stages configured to measure a first activation dead-time by counting a first number of time intervals between an input rising edge of the first PWM pulse and a first output rising edge of the output signal during the first time period;
      a second delay measurement circuit having a second series of measurement stages configured to measure a second activation dead-time by counting a second number of time intervals between an input rising edge of the second PWM pulse and a second output rising edge of the output signal during the second time period; and
      an adjustment circuit coupled to the first and second delay measurement circuits to receive the first and second measured activation dead-times respectively, the adjustment circuit configured to generate the control signal having:
         a first adjusted pulse width by adding the first measured activation dead-time to the second PWM pulse width during the second time period; and
         a second adjusted pulse width by adding the second measured activation dead-time to the third PWM pulse width during the third time period.

10. A power supply circuit comprising:
    a pulse-width modulation (PWM) circuit configured to generate a PWM signal including a first PWM pulse during a first time period and a second PWM pulse during a second time period after the first time period, the first PWM pulse having a first PWM pulse width, and the second PWM pulse having a second PWM pulse width; and
    a delay circuit including:
       a delay measurement circuit coupled with the PWM circuit to receive the PWM signal, the delay measurement circuit configured to measure an activation dead-time between the first PWM pulse and an output signal during the first time period; and an adjustment circuit coupled with the delay measurement circuit to receive the measured activation dead-time, and coupled with the PWM circuit to receive the PWM signal, the adjustment circuit configured to generate a control signal having an adjusted pulse width extending from the second PWM pulse width by the measured activation dead-time, the control signal prolonging an activation signal for switching the output signal during the second time period.

11. The power supply circuit of claim 10, wherein the delay measurement circuit is configured to measure the activation dead-time by counting a time lapse between an input rising edge of the first PWM pulse and an output rising edge of the output signal during the first time period.

12. The power supply circuit of claim 10, further comprising a power stage including:
a gate driver coupled with the delay circuit to receive the control signal, the gate driver configured to generate the activation signal based on a control rising edge of the control signal;
a high-side switch coupled to the gate driver, the high-side switch configured to switch the output signal from a low voltage to a high voltage based on the activation signal.

13. The power supply circuit of claim 12, wherein:
the gate driver is configured to generate a second activation signal based on a control falling edge of the control signal; and
the power stage includes a low-side switch coupled to the gate driver, the low-side switch configured to switch the output signal from the high voltage to the low voltage based on the second activation signal.

14. The power supply circuit of claim 10, further comprising a power stage including:
a gate driver coupled with the delay circuit to receive the control signal, the gate driver configured to generate the activation signal based on a control rising edge of the control signal;
a low-side switch coupled to the gate driver, the high-side switch configured to switch the output signal from a high voltage to a low voltage based on the activation signal.

15. The power supply circuit of claim 14, wherein:
the gate driver is configured to generate a second activation signal based on a control falling edge of the control signal; and
the power stage includes a high-side switch coupled to the gate driver, the low-side switch configured to switch the output signal from the low voltage to the high voltage based on the second activation signal.

16. The power supply circuit of claim 10, wherein:
the PWM circuit configure to generate the PWM signal including a third PWM pulse during a third time period after the second time period, the third PWM pulse having a third PWM pulse width;
the delay measurement circuit includes:
a first delay measurement circuit having a first series of measurement stages configured to measure a first activation dead-time by counting a first number of time intervals between an input rising edge of the first PWM pulse and a first output rising edge of the output signal during the first time period; and
a second delay measurement circuit having a second series of measurement stages configured to measure a second activation dead-time by counting a second number of time intervals between an input rising edge of the second PWM pulse and a second output rising edge of the output signal during the second time period; and the adjustment circuit is coupled to the first and second delay measurement circuits to receive the first and second measured activation dead-times respectively, the adjustment circuit configured to generate the control signal having:
a first adjusted pulse width by adding the first measured activation dead-time to the second PWM pulse width during the second time period; and
a second adjusted pulse width by adding the second measured activation dead-time to the third PWM pulse width during the third time period.

17. A delay circuit for use in a power supply system including a pulse-width modulation (PWM) circuit and a power stage circuit, the delay circuit configured to receive a PWM signal from the PWM circuit and an output signal from the power stage circuit, the PWM signal having a first PWM pulse during a first time period, a second PWM pulse during a second time period, and a third PWM pulse during a third time period, the delay circuit comprising:
a delay measurement circuit having a series of measurement stages configured to measure an activation dead-time between the first PWM pulse and the output signal; and
an adjustment circuit coupled to the delay measurement circuit to receive the measured activation dead-time, the adjustment circuit configured to generate a control signal having an adjusted pulse width by adding the measured dead-time to a PWM pulse width of the second PWM pulse, the control signal causing the output signal to switch during the second time period.

18. The power supply circuit of claim 17, wherein the delay measurement circuit is configured to measure the activation dead-time by counting a time lapse between an input rising edge of the first PWM pulse and an output rising edge of the output signal during the first time period.

19. The delay circuit of claim 17, wherein
a first delay measurement circuit having a first series of measurement stages configured to measure a first activation dead-time by counting a first number of time intervals between a first input rising edge of a first PWM pulse and a first output rising edge of a output signal during the first time period;
a second delay measurement circuit having a second series of measurement stages configured to measure a second activation dead-time by counting a second number of time intervals between a second input rising edge of the second PWM pulse and a second output rising edge of the output signal during the second time period; and
an adjustment circuit coupled to the first and second delay measurement circuits to receive the first and second measured activation dead-times respectively, the adjustment circuit configured to generate a control signal having:
a first adjusted pulse width by adding the first measured dead-time to the PWM pulse width of the second PWM pulse for switching the output signal during the second time period; and
a second adjusted pulse width by adding the second measured dead-time to a second PWM pulse width of the third PWM pulse for switching the output signal during the third time period.

20. The power supply circuit of claim 17, wherein the adjustment circuit includes:

a NOR gate configured to generate a reset signal in response to the PWM signal and a delay signal associated with the measured activation dead-time; and a SR-latch having an S input configured to receive the PWM signal and an R input coupled with the NOR gate to receive the reset signal, the SR latch configured to generate the control signal in response to the PWM signal and the reset signal.

\* \* \* \* \*